(12) United States Patent
Ujiie

(10) Patent No.: US 9,055,678 B2
(45) Date of Patent: Jun. 9, 2015

(54) MODULAR UNIT AND IMAGE FORMING APPARATUS INCORPORATING SAME

(71) Applicant: Masateru Ujiie, Kanagawa (JP)

(72) Inventor: Masateru Ujiie, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 323 days.

(21) Appl. No.: 13/670,663

(22) Filed: Nov. 7, 2012

(65) Prior Publication Data

US 2013/0120942 A1 May 16, 2013

(30) Foreign Application Priority Data

Nov. 16, 2011 (JP) ................................. 2011-250829

(51) Int. Cl.
*H05K 5/02* (2006.01)
*H04N 1/00* (2006.01)

(52) U.S. Cl.
CPC .............. *H05K 5/0256* (2013.01); *H04N 1/00* (2013.01); *H04N 1/00538* (2013.01); *H04N 1/00557* (2013.01); *H04N 1/00575* (2013.01); *H04N 2201/0082* (2013.01)

(58) Field of Classification Search
CPC ... H05K 5/0256; H04N 1/00; H04N 1/00557; H04N 1/00575; H04N 1/00538; H04N 2201/0082
USPC .......................................... 361/747; 399/107
See application file for complete search history.

(56) References Cited

U.S. PATENT DOCUMENTS

| | | | | |
|---|---|---|---|---|
| 6,651,351 | B1 * | 11/2003 | Christoph et al. | 33/503 |
| 7,970,312 | B2 * | 6/2011 | Ogata | 399/110 |
| 8,653,362 | B2 * | 2/2014 | Tsujishita | 174/50 |
| 8,767,231 | B2 * | 7/2014 | Nishikawa | 358/1.13 |
| 2002/0041775 | A1 * | 4/2002 | Ishii | 399/124 |
| 2006/0120746 | A1 * | 6/2006 | Lee et al. | 399/90 |
| 2010/0040398 | A1 * | 2/2010 | Shin | 399/367 |
| 2011/0267657 | A1 * | 11/2011 | Tsujishita | 358/296 |

FOREIGN PATENT DOCUMENTS

| | | |
|---|---|---|
| JP | 2009-73582 | 4/2009 |
| JP | 2009-265551 | 11/2009 |
| JP | 2012-143912 | 8/2012 |

* cited by examiner

*Primary Examiner* — Lisa Lea Edmonds
*Assistant Examiner* — Keith Depew
(74) *Attorney, Agent, or Firm* — Cooper & Dunham LLP

(57) ABSTRACT

A modular unit removably mounted to a main body includes a cover openably closable relative to a unit body of the modular unit and a movable member to move to the main body in conjunction with closing of the cover. As the cover is closed with the modular unit mounted to the main body, a projection provided to the movable member pushes a lever provided to the main body, and a detector provided to the main body detects that the lever is pushed by the projection of the movable member.

14 Claims, 9 Drawing Sheets

MODULAR UNIT AND IMAGE FORMING APPARATUS INCORPORATING SAME

CROSS-REFERENCE TO RELATED APPLICATION

This patent application is based on and claims priority pursuant to 35 U.S.C. §119 to Japanese Patent Application No. 2011-250829, filed on Nov. 16, 2011, in the Japan Patent Office, the entire disclosure of which is hereby incorporated by reference herein.

BACKGROUND OF THE INVENTION

1. Field of the Invention

The present invention generally relates to a removable unit and an image forming apparatus, such as a copier, a printer, a facsimile machine, or a multifunction machine including at least two of these functions, that includes a unit removably mounted in the apparatus.

2. Description of the Related Art

In image forming apparatuses, such as copiers and printers, there is an increasing demand for forming images on both sides of sheets of recording media (i.e., double-side printing or duplex printing) to save natural resources and become eco-friendly. At present, many compact image forming apparatuses, which are generally low-speed apparatuses, also have a conveyance unit for duplex printing (i.e., a reversal conveyance unit). On the other hand, there still is a certain demand for omitting the conveyance unit for duplex printing to keep the apparatus compact and save costs.

In view of the foregoing, optional conveyance, units for duplex printing retrofitted to a lateral side or rear side of the image forming apparatus have been proposed. Such conveyance units or feed units (hereinafter also "modular units") are removably mounted to an apparatus body and typically include a cover that is opened to expose an interior of the unit for removal of jammed sheets or maintenance work. Accordingly, before use, it is necessary to confirm whether the cover is closed and the removable module unit is mounted to the apparatus body properly.

For example, JP-2009-073582-A proposes a duplex conveyance unit that includes a cover to expose a top of the duplex conveyance unit, a planar feeler attached to the cover, and a detector in which a detection slit is formed. When the duplex conveyance unit is mounted to the apparatus body with the cover closed, the planar feeler fits in the detection slit, with which the detector deems that the duplex conveyance unit is mounted to the apparatus body and the cover is closed.

In this configuration, however, the detection slit is relatively narrow, and it is necessary that the planar feeler and the detection slit be precisely positioned relative to each other to confirm whether the duplex conveyance unit is properly mounted to the apparatus body with the cover closed.

SUMMARY OF THE INVENTION

In view of the foregoing, one embodiment of the present invention provides a modular unit removably mounted to a main body. The modular unit includes a cover openably closable relative to a unit body of the modular unit and a movable member to move to the main body in conjunction with closing of the cover. The movable member includes a projection to project more to the main body and push a lever provided to the main body as the cover is closed in a state in which the modular unit is mounted to the main body. When a detector provided to the main body detects that the lever is pushed by the projection of the movable member, it is deemed that the modular unit is mounted to the main body with the cover closed.

Another embodiment provides a detection mechanism to detect installation of a modular unit to an apparatus. The modular unit is removably mounted to the apparatus and includes a cover openably closable relative to a unit body of the modular unit and a movable member to move to the apparatus in conjunction with closing of the cover. The movable member includes a projection to project more to the apparatus as the cover is closed in a state in which the modular unit is mounted to the apparatus. The apparatus includes a lever and a detector, The lever is pushed by the projection of the movable member as the movable member moves to the apparatus in conjunction with closing of the cover. When the detector detects the lever pushed by the projection of the movable member, the detector deems that the modular unit is mounted to the apparatus with the cover closed.

In yet another embodiment, an image forming apparatus includes the modular unit and the main body described above.

BRIEF DESCRIPTION OF THE SEVERAL VIEWS OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
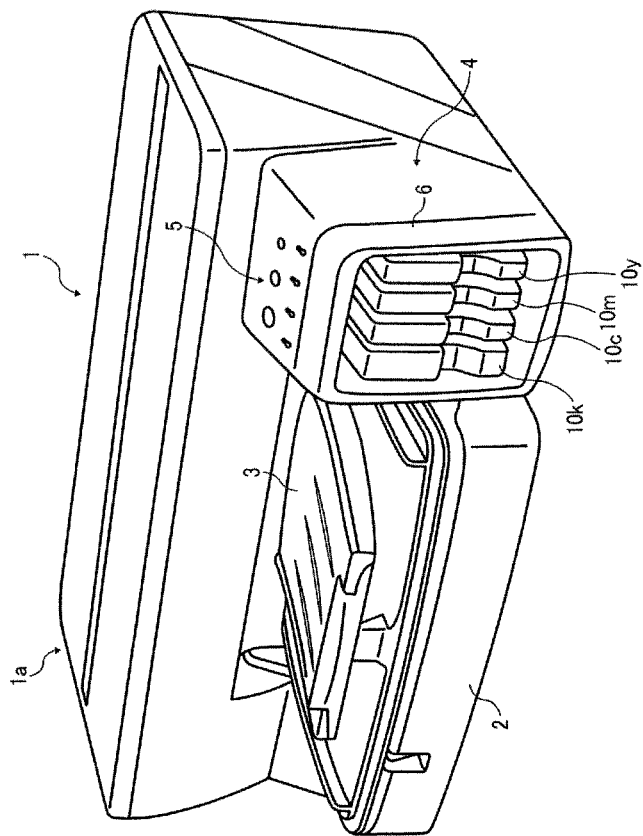
FIG. 1 is a perspective view that illustrates an exterior of an inkjet recording device as an image forming apparatus according to an embodiment of the present invention.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views thereof, a multicolor image forming apparatus according to an embodiment of the present invention is described.

It is to be noted that the suffixes k, c, m, and y attached to each reference numeral indicate only that components indicated thereby are used for forming black, cyan, magenta, and yellow images, respectively, and hereinafter may be omitted when color discrimination is not necessary.

FIG. 1 illustrates an exterior of an inkjet recording device as an image forming apparatus according to an embodiment of the present invention.

Referring to FIG. 1, an inkjet recording device 1 includes a main body 1a (i.e., an apparatus body), a feed tray 2 attached to the main body 1a, on which sheets of recording media fed to the main body 1a are stacked, and a discharge tray 3 to which sheets are discharged after images are formed thereon. The discharge tray 3 is removably attached to the body 1.

Additionally, a cartridge mount 4 to which ink cartridges 10k, 10c, 10m, and 10y are mounted is provided on a front side of the main body 1a, at an end (on the side of the feed tray 2 and the discharge tray 3). An operation panel 5 including operation buttons and a display is provided on an upper face of the cartridge mount 4.

The ink cartridges 10k, 10c, 10m, and 10y (also collectively "ink cartridges 10") for containing black (K), cyan (C), magenta (M), and yellow (Y) inks, respectively, can be installed in the cartridge mount 4 from the front side to the rear side of the main body 1a, A front cover 6 is provided to a front side of the cartridge mount 4. The front cover 6 can be opened and closed when the ink cartridges 10 are mounted and removed from the cartridge mount 4.

Figure 2:
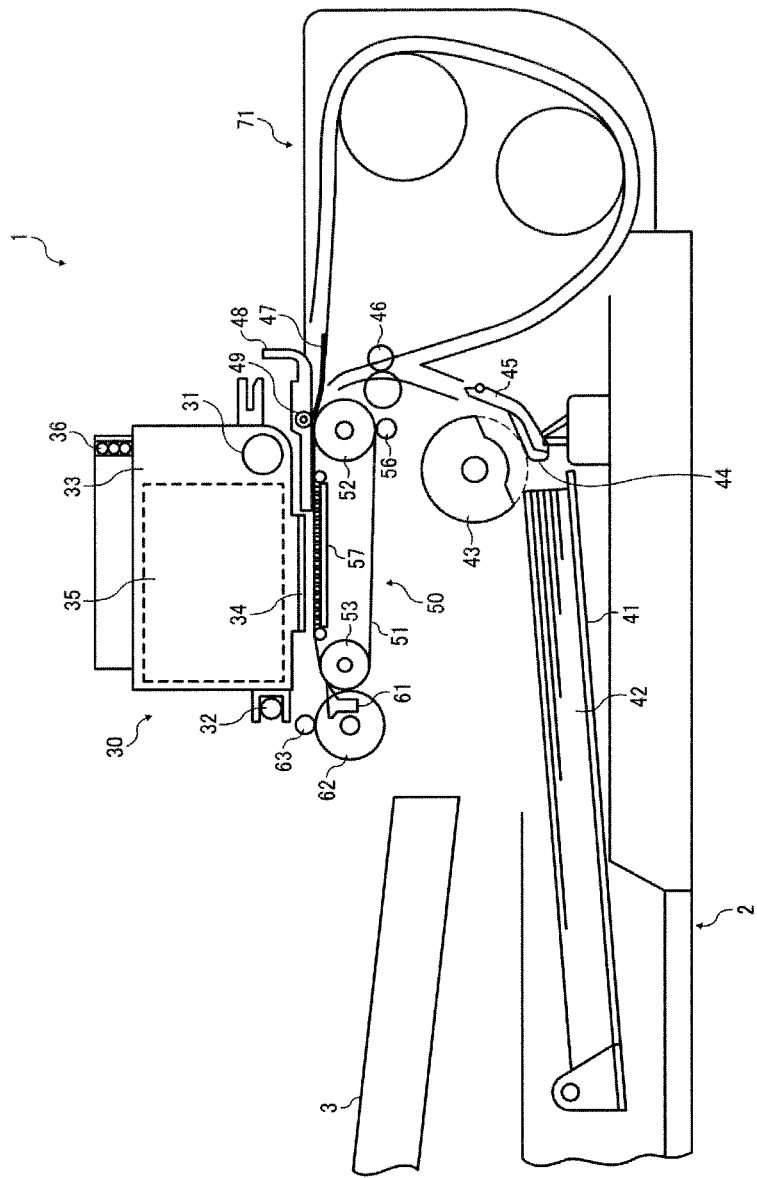
FIG. 2 is a schematic view of an interior of the inkjet recording device shown in FIG.

Next, mechanism of the inkjet recording device 1 is described with reference to FIG. 2. FIG. 2 is a schematic side view of the inkjet recording device 1, and the front side of the device is on the left in FIG. 2.

The inkjet recording device 1 includes main and sub guide rods 31 and 32, lying across right and left main plates, and a carriage 33 supported by the main and sub guide rods 31 and 32 slidably in a main scanning direction. More specifically, the carriage 33 can move in the main scanning direction while keeping in contact with the main and sub guide rods 31 and 32. The carriage 33 travels in the main scanning direction (perpendicular to the surface of the paper on which FIG. 2 is drawn) via a timing belt driven by a main scanning motor.

The carriage 33 includes recording heads or droplet ejection heads 34 for yellow, cyan, magenta, and black, respectively. Each recording head 34 has multiple nozzle lines for ejecting respective color ink droplets. The carriage 33 further includes liquid tanks 35 that are liquid containers for containing respective color inks supplied to the recording heads 34 The respective color inks are supplied from the ink cartridges 10 mounted to the cartridge mount 4 to the liquid tanks 35 through flexible supply tubes 36.

The inkjet recording device 1 further includes a feed roller 43 to send out one at a time the sheets 42 from a sheet table 41 of the feed tray 2 and a separation pad 44 facing the feed roller 43. The separation pad 44 includes a material whose frictional coefficient is relatively large.

The inkjet recording device 1 further includes a guide 45 to guide the sheet 42 beneath the recording heads 34, a counter roller 46, a transport guide 47, a pressure member 48 provided with an edge pressure roller 49, and a conveyance belt 51. The conveyance belt 51 is designed to electrostatically absorb and transport the sheet 42 to a position facing the recording heads 34. In the present embodiment, the carriage 33 and the conveyance belt 51 together form an image forming unit 30 housed in the main body 1a, to form images on the sheets 42.

The conveyance belt 51 is an endless belt and stretched between a conveyance roller 52 and a tension roller 53. The conveyance belt 51 is designed to rotate in forward and reverse directions in a sub-scanning direction. The direction in which the conveyance belt 51 transports the sheets 42 is hereinafter referred to as belt conveyance direction.

The inkjet recording device 1 further includes a charging roller 56 for charging an outer surface of the conveyance belt 51. The charging roller 56 is disposed to contact an outer surface of the conveyance belt 51 and rotate as the conveyance belt 51 rotates. Additionally, a guide member 57 serving as a platen is provided on the back side of the conveyance belt 51, corresponding to a printing area in which images are formed by the recording heads 34. It is to be noted that, although the conveyance belt 51 employs electrostatic adsorption in the description above, the conveyance belt 51 may adsorb sheets otherwise, for example, using negative pressure.

The inkjet recording device 1 further includes a separation claw 61 to separate the sheet 42 from the conveyance belt 51 and discharge rollers 62 and 63. The discharge tray 3 is positioned beneath the discharge roller 62.

A duplex unit 71, which is a modular unit mountable on and removable from the main body 1a, is provided on a rear side of the main body 1a. For duplex printing, the sheet 42 can be sent back by reverse rotation of the conveyance belt 51. Then, the duplex unit 71 draws the sheet 42 therein, reverses, and transports the sheet 42 toward the counter roller 46.

Operation of the inkjet recording device 1 according to the present embodiment is described below.

The sheet 42 is fed from the sheet feed tray 2 upward, specifically, substantially vertically, guided by the guide 45, and then sandwiched between the conveyance belt 51 and the counter roller 46. Further, a leading edge thereof is guided by the transport guide 47 and then pressed against the conveyance belt 51 by the edge pressure roller 49, and thus a transport direction of the sheet 42 is turned.

At that time, an alternating-current (AC) voltage, in which positive output and negative output alternate, is applied to the charging roller 56 from an ac bias supply unit of a controller. Thus, positively charged zones and negatively charged zones that have a predetermined or given width are formed alternately on the conveyance belt 51 in the circumferential direction, that is, the sub-scanning direction. The sheet 42 is adsorbed on the conveyance belt 51 having alternating zones of positive charge and negative charge. Then, the sheet 42 is transported in the sub-scanning direction as the conveyance belt 51 rotates.

Then, while the carriage 33 moves, ink droplets are ejected onto the sheet 42 being kept motionless, forming an image by one line by driving the recording heads 34 according to image signals. Subsequently, the sheet 42 is transported for a given distance, and then a subsequent line is recorded thereon. When a signal indicating recording completion or arrival of a trailing edge of the sheet 42 at a recording area is output, image recording operation is completed and the sheet 42 is discharged onto the discharge tray 3.

The conveyance belt 51 is designed to rotate in the reverse direction to return the sheet 42 to the duplex unit 71 after image recording, or transport the sheet 42 fed from the discharge tray 3, separately from transporting the sheet fed from the feed tray 2 for image recording.

A sheet conveyance unit of the inkjet recording device 1 is described below with reference to FIGS. 3 and 4.

Figure 3:
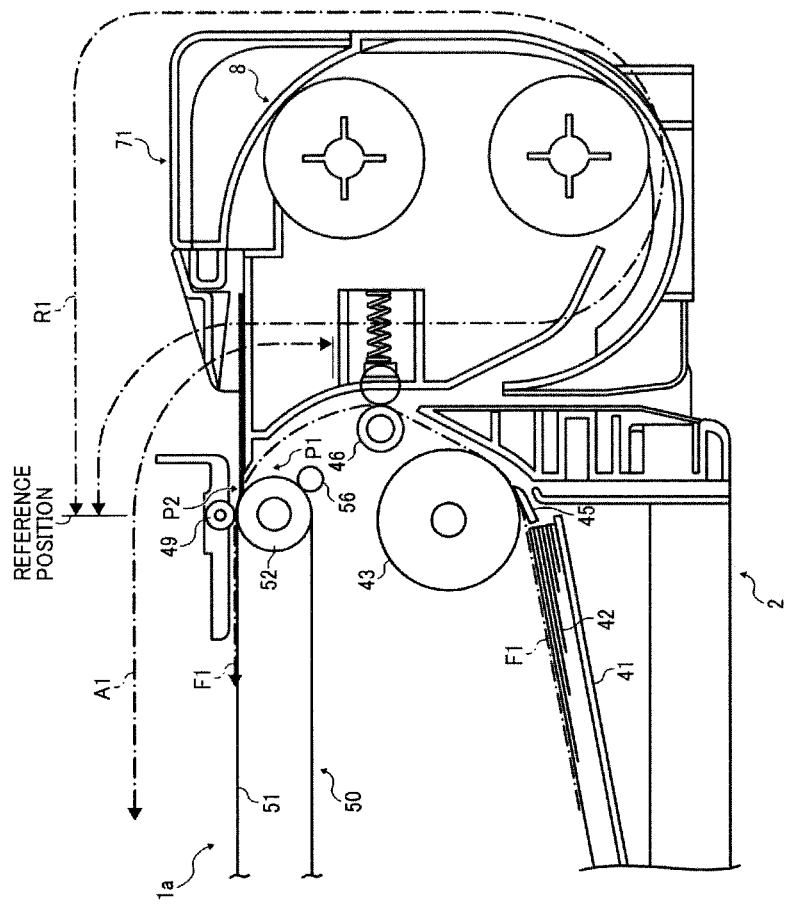
FIG. 3 illustrates a configuration of a sheet conveyance unit and a first sheet conveyance channel.
Figure 4:
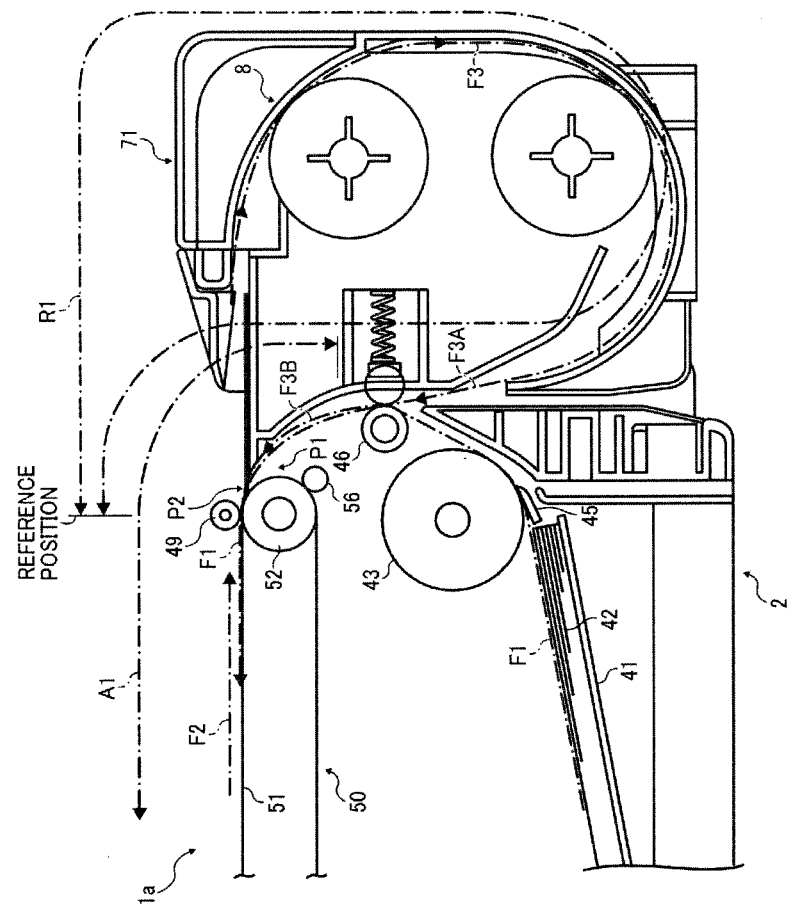
FIG. 4 illustrates the sheet conveyance unit shown in FIG. 3 and a second sheet conveyance channel.

As shown in FIGS. 3 and 4, in the sheet conveyance unit, a first conveyance channel A1 and a second conveyance channel R1 serving as a reversal conveyance channel are formed. Through the first conveyance channel A1, sheets are transported in the forward or reverse direction in single-side printing or double-side (duplex) printing, and the sheets are reversed through the second conveyance channel R1 by a reversal conveyance unit 8 for duplex printing.

The first conveyance channel Al includes positions facing the counter roller 46, the conveyance roller 52, and a recording area (in FIGS. 3 and 4, the broken line starts slightly above the counter roller 46), thus including a route to transport the sheet to a carrying-in position P1 where the sheet is adsorbed onto the conveyance belt 51 and a route to transport the sheet from the recording area to the discharge tray 3.

The second conveyance channel RI includes a lead-in position P2 where the sheet 42 is moved to the conveyance belt 51 at an angle different from a carrying-in angle meaning an angle of the sheet relative to the conveyance belt 51 in the first conveyance channel A1 (in FIGS. 3 and 4, the sheet 42 is substantially vertical). In the present embodiment, the sheet 42 at the lead-in position P2 is substantially perpendicular to the carrying-in angle. Along the second conveyance channel R1, the sheet 42 transported by the conveyance belt 51 is reversed and returned to the carrying-in position P1 in the lust conveyance channel A1, thereby transporting the sheet 42 again to the conveyance belt 51.

As the conveyance belt 51 rotates along the circumferential surface of the conveyance roller 52, the sheet 42 adsorbed on the conveyance belt 51 electrostatically is separated therefrom due to the curvature.

As shown in FIG. 3, only the first conveyance channel A1 is used in single-side printing. Initially, as indicated by arrow F1 shown in FIGS. 3 and 4, the sheet 42 sent from the sheet table 41 is transported by the counter roller 46 to the carrying-in position P1 where adsorption of the sheet 42 onto the conveyance belt 51 is started. Subsequently, the sheet 42 is conveyed to a position between the conveyance roller 52 and the edge pressure roller 49, from which the sheet 42 is transported to the recording area facing the recording heads 34 (shown in FIG. 2) as the conveyance belt 51 travels.

When image recording in single-side printing is completed, the sheet 42 is transported further in the forward direction, separated from the conveyance belt 51 by the separation claw 61 (shown in FIG. 2), and discharged by the discharge rollers 62 and 63 to the discharge tray 3.

By contrast, in duplex printing, both of the first and second conveyance channels A1 and R1 are used as shown in FIG. 4. In image recording on a first side thereof, the sheet 42 is transported as shown in FIG. 3 except conveyance to the discharge tray 3. After image recording on the first side is completed, the conveyance roller 52 and the edge pressure roller 49 rotate in reverse, thereby returning the sheet 42, as indicated by arrow F2 shown in FIG. 4, from the recording area to the carrying-in position P1 and to the lead-in position P2 in the second conveyance channel R1. Subsequently, the sheet 42 is reversed as indicated by arrows F3, F3A, and F3B and transported again to the counter roller 46 and further to the recording area. After an image is formed on a second side thereof, the sheet is discharged to the discharge tray 3 similarly to the discharge operation described above with reference to FIG. 3.

Next, the duplex unit 71 that can be removably mounted to the main body 1a is described with reference to FIGS. 5 and 6.

Figure 5:
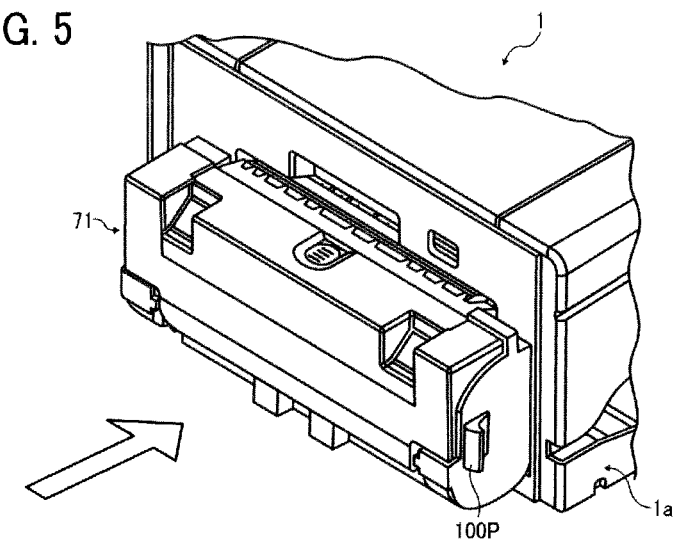
FIG. 5 is a perspective view illustrating a duplex unit mounted to an apparatus body according to an embodiment.
Figure 6:
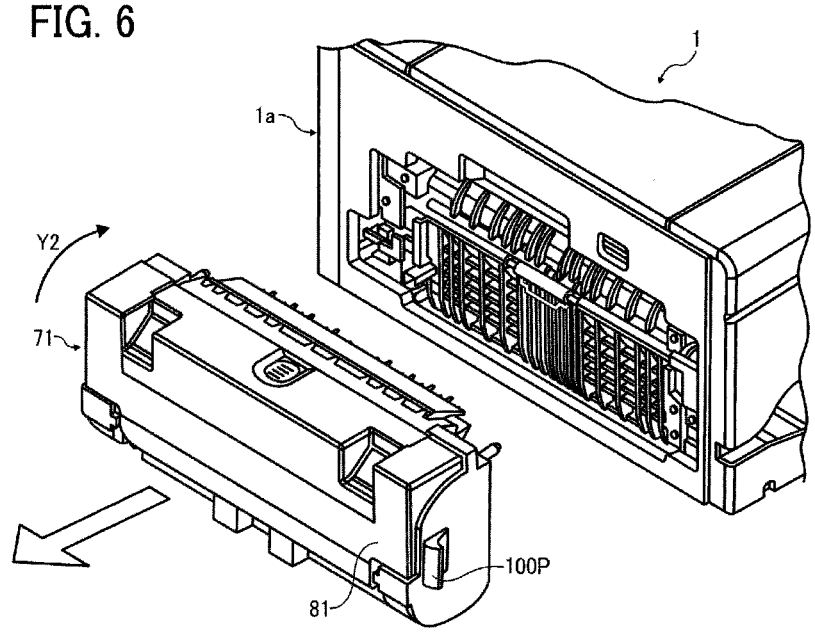
FIG. 6 is a perspective view illustrating the duplex unit separated from the apparatus body shown in FIG. 5.

The duplex unit 71 is mountable to the main body 1a as shown in FIG. 5 and removable from the main body 1a as shown in FIG. 6.

Users can mount and remove the duplex unit 71 from the main body 1a using a unit including a projection 100P projecting from a side of the duplex unit 71. When the user operates the operation portion 100P, a lock mechanism inside the duplex unit 71 is unlocked, and the duplex unit 71 can be removed from the main body 1a.

Figure 7:
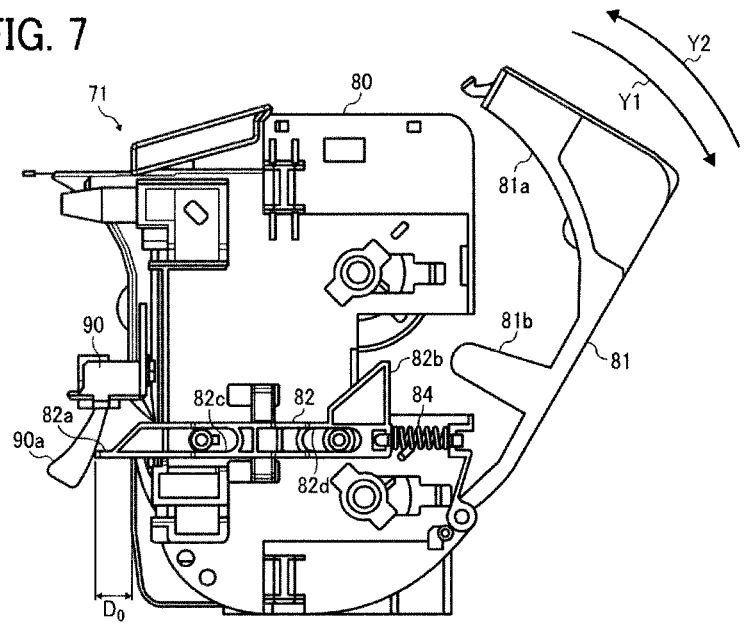
FIG. 7 is a side view of the duplex unit with a cover kept open.
Figure 8:
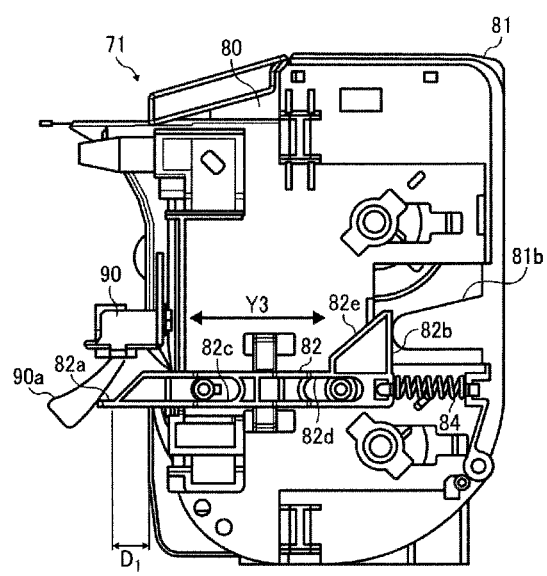
FIG. 8 is a side view of the duplex unit with the cover closed.
Figure 9:
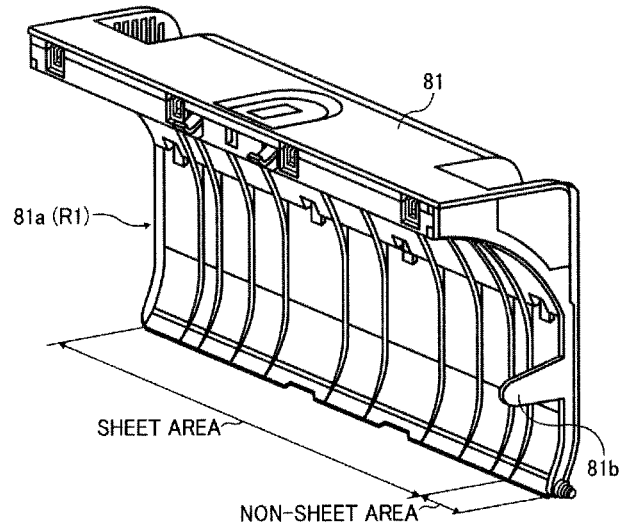
FIG. 9 is a perspective view of the cover of the duplex unit.

Referring to FIGS. 7 through 9, the duplex unit 71 is described in further detail. En particular, opening and closing of a cover 81 and a detection of whether the duplex unit 71 is mounted properly are described below. It is to be noted that reference characters 82c and 82d shown in FIGS. 7 and 8 represent slots formed in the movable member 82.

As shown in FIG. 7, the duplex unit 71 includes a unit body 80, the cover 81, and a movable member 82. Inside the unit body 80, the reversal conveyance unit 8 including the second conveyance channel R1 (shown in FIG. 4), conveyance rollers to reverse the sheet 42, a drive mechanism to drive the conveyance rollers, and the movable member 82 are provided. The reversal conveyance unit 8 reverses and transports the sheet 42 again to the image forming unit 30 (shown in FIG. 2) in duplex printing.

The cover 81 is attached to the unit body 80 and openably closable relative thereto. In the configuration shown in the drawings, the cover 81 is hinged to the unit body 80 and rotated down and up in directions indicated by arrows Y1 and Y2 (hereinafter "direction Y1" and "direction Y2") to be opened and closed. The cover 81 can serve as an openably closable member.

The cover 81 can also function as a planar conveyance guide defining the second conveyance channel R1 of the reversal conveyance unit 8. Specifically, an inner face 81a (on the side of the unit body 80) of the cover 81 guides the sheet 42. That is, when the cover 81 is closed, the second conveyance channel R1 is defined by the inner face 81a.

Additionally, the cover 81 includes a protruding portion 8 lb projecting in the direction Y2 in which the cover 81 is closed as shown in FIG. 7. As shown in FIG. 9, the protruding portion 81b is positioned in a non-sheet area outside and adjacent to a sheet area of the second conveyance channel R1 where sheets can pass through.

The movable member 82 is supported by the unit body 80 movably to the main body 1a (shown in FIG. 6 and on the left in FIGS. 7 and 8) in conjunction with closing movement of the cover 81 from the position (open state) shown in FIG. 7 to the position (closed state) shown in FIG. 8. Specifically, the movable member 82 is long in the direction indicated by arrow Y3 (hereinafter "direction Y3") in which the movable member 82 moves (lateral direction in FIGS. 7 and 8). Additionally, a projection 82a is provided to a first end of the movable member 82 on the side of the main body 1a (shown in FIG. 6 and on the left in FIGS. 7 and 8), and a contact portion 82b is provided to a second end portion of the movable member 82 (on the right in FIGS. 7 and 8) opposite the first end portion thereof. The contact portion 82b can contact the protruding portion 81b of the cover 81. With this configuration, the movable member 82 can move, being pushed by the protruding portion 81b in conjunction with closing movement of the cover 81.

The projection 82a of the movable member 82 is designed to project more toward the main body 1a (shown in FIG. 6) as the cover 81 is closed in a state in which the duplex unit 71 is mounted to the main body I a. More specifically, when the cover 81 is open as shown in FIG. 7, the amount by which the projection 82a projects is an amount $D_0$. When the cover 81 is closed, the projecting amount increases to an amount $D_1$ greater than the amount $D_0$.

Accordingly, when the duplex unit 71 is mounted to the main body 1a (shown in FIG. 6) with the cover 81 closed, the projection 82a pushes a lever 90a provided inside the main body 1a. With the lever 90a being pushed, a detector 90 provided inside the main body 1a can detect the duplex unit 71 being mounted. Additionally, the projection 82a is planar, which is advantageous over thick members because the planer projection 82a can gain stroke for pushing the lever 90a and rotate the lever 90a securely.

For example, the detector 90 includes a micro switch disposed inside the main body 1a and turned on or off when the lever 90a rotates a predetermined threshold amount or greater. Alternatively, the lever 90a can be a shading feeler, and the detector 90 may be an optical sensor to detect a rotational position of the shading feeler.

Additionally, the second end portion of the movable member 82 (opposite to the main body 1a) is connected to the unit body 80 via a coil spring 84. The coil spring 84 constantly exerts an elastic force to move away the movable member 82 from the main body 1a (to the right in FIGS. 7 and 8). Accordingly, when the cover 81 is closed, the movable member 82 moves to the main body 1a against the elastic force exerted by the coil spring 84. By contrast, when the cover 81 is opened, the movable member 82 is returned to the position shown in FIG. 7 by the elastic force of the coil spring 84.

Next, a configuration of the movable member 82 and installation of the movable member 82 to the unit body 80 are described below.

Figure 10:
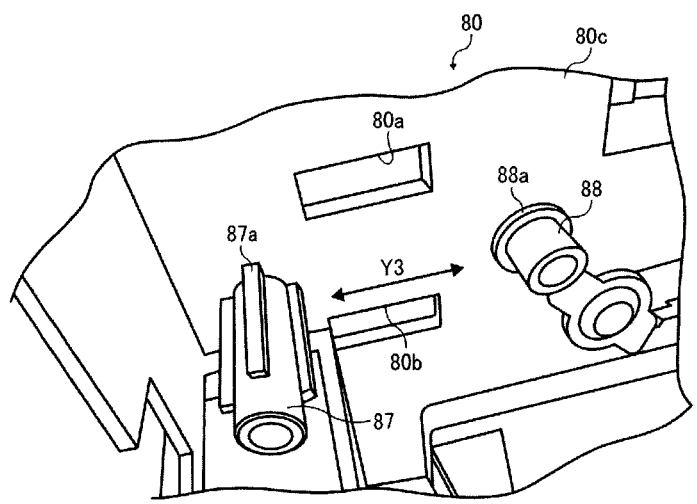
FIG. 10 is a perspective view of an apparatus body according to an embodiment.

FIG. 10 illustrates a state in which the movable member 82 is not installed in the unit body 80.

As shown in FIG. 10, slots 80a and 80b, serving as first slots, shaped like long winders are formed in the unit body 80. The slots 80a and 80b are long in the direction Y3 in which the movable member 82 moves are formed. The slots 80a and 80b penetrate a side plate 80c defining the unit body 80 from the proximal side (to which the movable member 82 is attached) to the distal side in FIG. 10 (inner side of the unit body 80).

Figure 11:
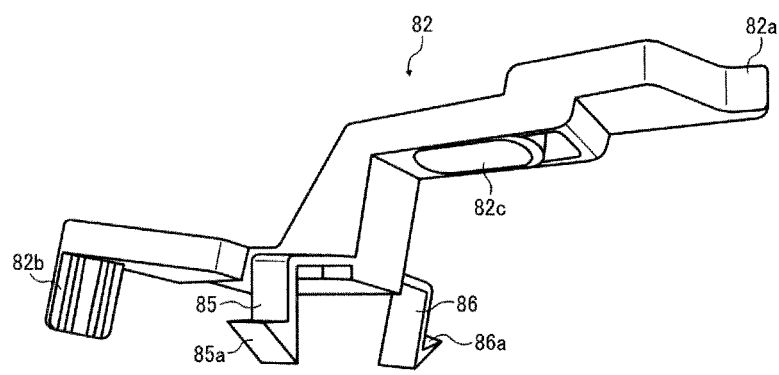
FIG. 11 is a perspective view of a movable member according to an embodiment as viewed from above obliquely.
Figure 12:
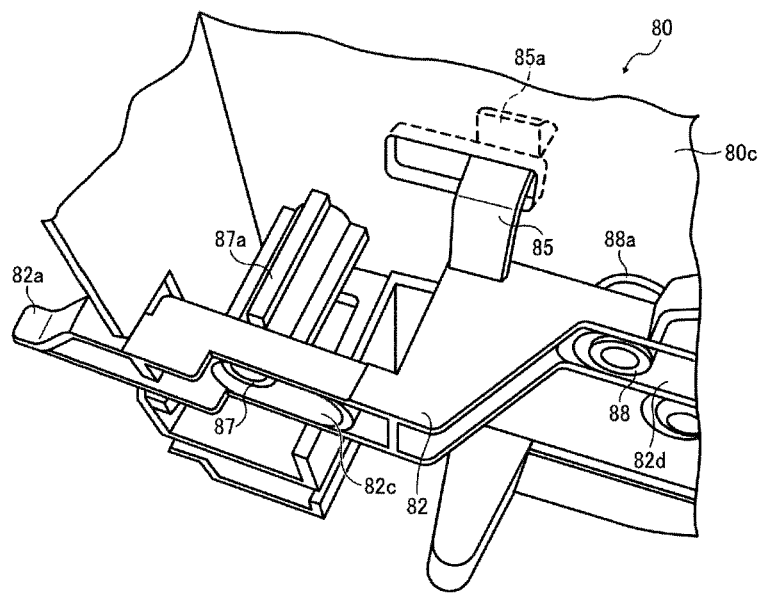
FIG. 12 is a perspective view of the movable member, shown in FIG. 11, being installed in the apparatus body.

Referring to FIGS. 11 and 12, the movable member 82 includes bent legs 85 and 86 to be inserted into the slots 80a and 80b formed in the unit body 80 when the movable member 82 is installed in the unit body 80. The bent legs 85 and 86 can move along the slots 80a and 80b (lateral direction in FIG. 11).

The bent legs 85 and 86 include claws 85a and 86a at ends thereof. The claws 85a and 86a are bent perpendicular to the lateral direction in FIG. 11, in which the bent legs 85 and 86 move, and retained by the slots 80a and 80b formed in the unit body 80 not to be disengaged therefrom. As shown in FIG. 12, the claws 85a and 86a engage (are caught on) the side of the side plate 80c when the movable member 82 is installed in the unit body 80. This configuration can prevent the movable member 82 from falling or tilting in a direction perpendicular to the direction in which the movable member 82 moves relative to the unit body 80.

Additionally, as shown in FIG. 10, first and second bosses 87 and 88 project from the unit body 80 to the movable member 82 (to the proximal side in FIG. 10). The first and second bosses 87 and 88 are respectively fitted in the slots 82c and 82d (second slots) formed in the movable member 82. The first and second bosses 87 and 88 can be cylindrical and arranged at a distance from each other in the direction Y3 in which the movable member 82 moves. This configuration can restrain the movable member 82 from rotating vertically when the movable member 82 is installed in the unit body 80.

It is to be noted that the first and second bosses 87 and 88 are not necessarily cylindrical. For example, the first and second bosses 87 and 88 may be shaped into columns or polygonal columns.

In the configuration shown in the drawings, the first boss 87 projects more to the movable member 82 than the second boss 88 in accordance with the shape of the movable member 82 that is bent, as shown in FIGS. 11 and 12, at a middle portion in its longitudinal direction so that a left portion (on the side of the main body 1a) in FIG. 12 is away from the unit body 80.

Additionally, the first boss 87 includes multiple ribs 87a, serving as restriction portions, projecting from its outer circumference outward in the direction of diameter and extending in the longitudinal direction of the first boss 87 except an edge area on the side of the movable member 82 (opposite the side plate 80c). Referring to FIG. 12, the multiple ribs 87a are arranged at predetermined intervals in the circumferential direction of the first boss 87 and shaped so that an end face of each rib 87 contacts the side face of the movable member 82 facing the unit body 80 when the movable member 82 is attached to the unit body 80.

Additionally, as shown in FIG. 10, the second boss 88 includes a circular restriction projection 88a (restriction portion) projecting from its outer circumference outward in the direction of diameter. In the direction perpendicular to the direction of diameter, the circular restriction projection 88a does not present in a predetermined end area on the side of the movable member 82 (opposite the side plate 80c). The circular restriction projection 88a can be cylindrical and slightly larger than the outer circumference of the second boss 88 in the direction of diameter. As shown in FIG. 12, similarly to the ribs 87a, the circular restriction projection 88a is shaped so that an end face (perpendicular to the circumferential face) thereof contacts the side face of the movable member 82 facing the unit body 80 when the movable member 82 is attached to the unit body 80.

As described above, in installation of the movable member 82, the ribs 87a and the circular restriction projection 88a can prevent the movable member 82 from moving toward the unit body 80. Thus, the movable member 82 can be prevented from falling or tilting down to the unit body 80.

Relating to this configuration, as shown in FIGS. 8 and 12, the slots 82c and 82d (second slots) into which the first and second bosses 87 and 88 are inserted are formed in the movable member 82. The slots 82c and 82d are long in the direction Y3 (lateral direction in FIG. 8) in which the movable member 82 moves. In installation of the movable member 82 in the unit body 80, the slots 82c and 82d of the movable member 82 move in the direction Y3 in which the movable member 82 moves guided by the first and second bosses 87 and 88. This configuration enables reliable movement of the movable member 82.

Figure 13:
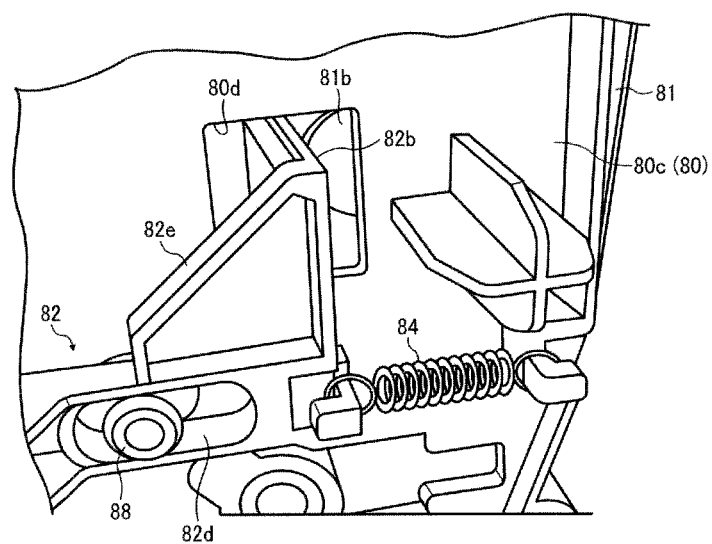
FIG. 13 is a perspective view of a contact portion of the movable member as viewed from a lateral side of the apparatus body.
Figure 14:
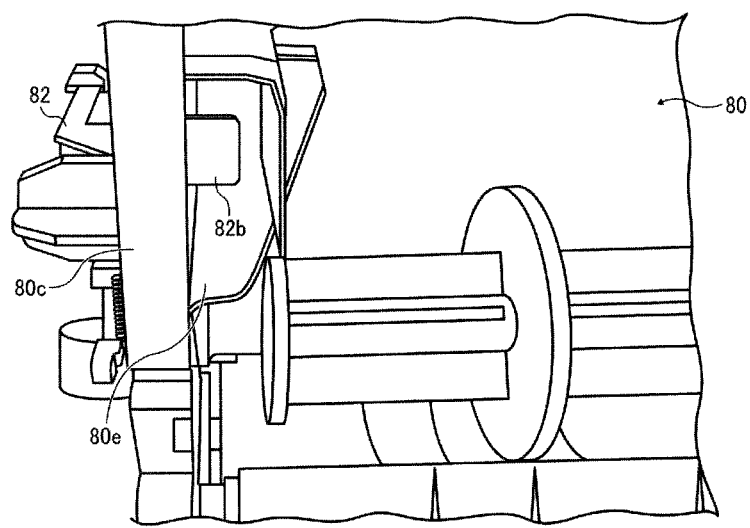
FIG. 14 is a perspective view of the contact portion of the movable member as viewed from a rear side of the apparatus body.

As shown in FIGS. 13 and 14, a support portion 82e is formed in an upper portion of the movable member 82 on the side opposite the projection 82a, and the contact portion 82b projects from the support portion 82e to the unit body 80 (side plate 80c). The contact portion 82b is planar. That is, the contact portion 82b is perpendicular to both of the side plate 80c of the unit body 80 and the direction Y in which the movable member 82 moves. The projection 82a of the movable member 82 penetrates into a window 80d that is a penetration hole formed in the side plate 80c of the unit body 80 and projects into an interior of the unit body 80. It is to be noted that the cover 81 is opened in FIG. 14.

Additionally, as shown in FIG. 14, on an inner side of the side plate 80c (inner side of the unit body 80), a communicating path 80e continuous with (communicating with) the window 80d is provided. Being pressed by the protruding portion 81b (shown in FIG. 13) of the cover 81, the contact portion 82b passes through the communicating path 80e to the distal side in FIG. 14.

Referring to FIGS. 7 and 8, descriptions are given below of installation of the duplex unit 71 into the main body 1a and confirmation of whether the cover 81 is closed.

As shown in FIG. 7, when the cover 81 is open, the protruding portion 81b of the cover 81 does not yet push the contact portion 82b. Accordingly, the movable member 82 is retained on the right side in FIG. 7, away from the main body 1a (shown in FIG. 6), by the coil spring 84. At that time, the amount by which the projection 82a projects is the amount $D_0$, and the projection 82a does not yet push the lever 90a even though the duplex unit 71 is mounted to the main body 1a.

When the cover 81 is lifted from the state shown in FIG. 7 and closed as shown in FIG. 8, the protruding portion 81b pushes the contact portion 82b to the left in FIG. 8, to the main body 1a against the elastic force exerted by the coil spring 84. Thus, the movable member 82 moves to the main body 1a. As the movable member 82 moves, the projecting amount of the projection 82a increases to the amount $D_1$ from the amount $D_0$. With this movement, the lever 90a is pushed by the projection 82a and rotates clockwise in FIG. 8. Rotation of the lever 90a turns the detector 90 on (or off), and thus it can be known that duplex unit 71 is set in the main body 1a.

If the cover 81 is not closed fully or at all when the duplex unit 71 is set in the main body 1a, the projecting amount of the projection 82a does not yet reach the projection amount $D_1$. Accordingly, the projection 82a does not rotate the lever 90a to a detection position to turn on (or off) the detector 90. In this case, it can be deemed that the duplex unit 71 is not set in the main body 1a properly. Thus, the amount $D_1$ is set such that the detector 90 is turned on (or off) only when the duplex unit 71 is mounted properly to the main body 1a.

Additionally, also when the duplex unit 71 is not properly or fully set in the main body 1a, the distance between the projection 82a and the lever 90a is greater than that in the state in which it is set properly. That is, the amount by which the lever 90a rotates is smaller, and the detector 90 is not turned on (or off). Also in this case, it can be easily deemed that the duplex unit 71 is not properly set in the main body 1a.

As described above, the duplex unit 71 according to the above-described embodiment is configured such that, when the duplex unit 71 is mounted to the main body 1a with the cover 81 closed, the projection 82a, which projects substantially to the main body 1a in accordance with closing operation of the cover 81, pushes the lever 90a provided to the main body 1a. As the lever 90a is thus pushed, the detector 90 provided to the main body 1a can detect the projection 82a. With this configuration, it can be known or confirmed simultaneously that the duplex unit 71 is mounted in the main body 1a and the cover 81 is closed.

Thus, in the duplex unit 71 according to the above-described embodiment, only the operation of the projection 82a pushing the lever 90a can be necessary for detecting or checking whether the duplex unit 71 is mounted in the main body 1a and the cover 81 is closed. Accordingly, the relative positions of the projection 82a and the lever 90a can be easily defined, and precise positioning is not necessary differently from configurations employing feelers and slits. Therefore, the above-described embodiment enables reliable detection of whether the duplex unit 71 is mounted in the main body 1a and the cover 81 is closed.

Additionally, rotation of the movable member 82 can be inhibited by the first and second bosses 87 and 88. Simultaneously, the movable member 82 can be prevented from falling or tilting down in directions perpendicular to the direction Y3 in which the movable member 82 moves by the claws 85a and 86a of the bent legs 85 and 86, the ribs 87a, and the circular restriction projection 88a. Therefore, movement of the movable member 82 can be stable, and it can ensure that the projection 82a pushes against the lever 90a.

Additionally, since the lever 90a and the detector 90 are disposed inside the main body 1a, the main body 1a from which the duplex unit 71 is removed can be more compact compared with a case in which those components are disposed outside the main body 1a. Additionally, this configuration can prevent the user from touching the detector 90.

It is to be noted that, although the description above concerns the duplex unit 71, above-described various features of this specification can adapt to any units that are removably mountable to a main body and include a openably closable member. Above-described various features of this specification are not limited to inkjet image forming apparatuses but can adapt to electrophotographic image forming apparatuses similarly.

Numerous additional modifications and variations are possible in light of the above teachings. It is therefore to be understood that, within the scope of the appended claims, the disclosure of this patent specification may be practiced otherwise than as specifically described herein.

What is claimed is:

1. A modular unit removably mounted to a main body, the modular unit comprising:
   a cover openably closable relative to a unit body of the modular unit; and
   a movable member to move to the main body in conjunction with closing of the cover, the movable member including a projection that pushes a lever provided to the main body as the cover is closed with the modular unit mounted to the main body,
   wherein a detector provided to the main body detects that the lever is pushed by the projection of the movable member, and
   wherein the cover comprises a protruding portion protruding in a direction in which the cover is closed,
   the projection of the movable member is positioned in a first end portion of the movable member, and
   a contact portion to be pushed by the protruding portion of the cover is provided to a second end portion of the movable member opposite the first end portion.

2. The modular unit according to claim 1, wherein
   the movable member extends in a direction in which the movable member moves,
   the first end portion of the movable member is provided on a side of the main body in a longitudinal direction of the movable member,
   the second end portion is connected to the unit body, and
   the movable member moves when the protruding portion of the cover pushes the contact portion of the movable member in conjunction with closing of the cover.

3. The modular unit according to claim 1, wherein a first slot is formed in the unit body and extending in a direction in which the movable member moves,
   the movable member comprises a bent portion bent in a direction perpendicular to the direction in which the movable member moves,
   the bent portion is inserted into the first slot formed in the unit body and movable in the direction in which the movable member moves, and
   the bent portion includes a claw at an end thereof to be retained by the first slot formed in the unit body.

4. The modular unit according to claim 1, wherein the unit body comprises a boss projecting toward the movable member,
- the boss is inserted into a second slot formed in the movable member, and
- the second slot extends in the direction in which the movable member moves.

5. The modular unit according to claim 4, wherein the boss of the unit body is cylindrical and comprises a restriction portion projecting outward in a direction of diameter, and
- an end face of the restriction portion of the boss contacts a face of the movable member on a side of the unit body.

6. The modular unit according to claim 1, further comprising a reversal conveyance unit defining an internal reversal conveyance channel,
- wherein the main body is an image forming apparatus in which an image forming unit is housed, and
- the reversal conveyance unit reverses and transports sheets of recording media through the internal reversal conveyance channel to the image forming unit.

7. A detection mechanism to detect installation of a modular unit to an apparatus, the mechanism comprising:
- a main unit;
- a modular unit removably mounted to the apparatus, the modular unit including:
  - a cover openably closable relative to a unit body of the modular unit, and
  - a movable member to move to the apparatus in conjunction with closing of the cover,
  - the movable member including a projection to project more to the apparatus as the cover is closed with the modular unit mounted to the apparatus;
- a lever provided to the apparatus and pushed by the projection of the movable member as the movable member moves to the apparatus in conjunction with closing of the cover; and
- a detector provided to the apparatus that detects that the lever is pushed by the projection of the movable member,
- wherein the cover comprises a protruding portion protruding in a direction in which the cover is closed,
- the projection of the movable member is positioned in a first end portion of the movable member, and
- a contact portion to be pushed by the protruding portion of the cover is provided to a second end portion of the movable member opposite the first end portion.

8. The mechanism according to claim 7, wherein the lever and the detector are provided inside the apparatus.

9. The detection mechanism according to claim 7, wherein the detector comprises a micro switch disposed inside the apparatus, activated upon the lever rotating a predetermined threshold amount.

10. The detection mechanism according to claim 7, wherein the lever comprises a shading feeler and the detector comprises an optical sensor to detect a rotational position of the shading feeler.

11. An image forming apparatus comprising:
- an image forming unit;
- a modular unit removably mounted to the apparatus, the modular unit including:
  - a cover openably closable relative to a unit body of the modular unit, and
  - a movable member to move to the apparatus in conjunction with closing of the cover, the movable member including a projection positioned in an end portion on a side of the apparatus;
- a lever provided to the apparatus and pushed by the projection of the movable member as the movable member moves to the apparatus in conjunction with closing of the cover; and
- a detector provided to the apparatus that detects that the lever is pushed by the projection of the movable member,
- wherein the cover comprises a protruding portion protruding in a direction in which the cover is closed,
- the projection of the movable member is positioned in a first end portion of the movable member, and
- a contact portion to be pushed by the protruding portion of the cover is provided to a second end portion of the movable member opposite the first end portion.

12. The image forming apparatus according to claim 11, wherein
- the modular unit further comprises a reversal conveyance unit defining an internal reversal conveyance channel, and
- the reversal conveyance unit reverses and transports sheets of recording media through the internal reversal conveyance channel to the image forming unit.

13. The image forming apparatus according to claim 12, wherein the cover comprises an inner face that guides the sheet when the cover is closed and defines the internal reversal conveyance channel.

14. The image forming apparatus according to claim 13, wherein
- the internal reversal conveyance channel defines a sheet area through which the sheets of recording media pass, and
- the protruding portion of the cover is positioned outside the sheet area of the internal reversal conveyance channel.

* * * * *